United States Patent
Kärkkäinen et al.

(10) Patent No.: US 9,035,281 B2
(45) Date of Patent: May 19, 2015

(54) GRAPHENE DEVICE AND METHOD OF FABRICATING A GRAPHENE DEVICE

(75) Inventors: Asta Maria Kärkkäinen, Helsinki (FI); Samiul Md Haque, Espoo (FI); Alan Colli, Cambridge (GB); Pirjo Marjaana Pasanen, Helsinki (FI); Leo Mikko Johannes Kärkkäinen, Helsinki (FI); Mikko Aleksi Uusitalo, Helsinki (FI); Reijo Kalervo Lehtiniemi, Helsinki (FI)

(73) Assignee: Nokia Technologies Oy, Espoo (FI)

( * ) Notice: Subject to any disclaimer, the term of this patent is extended or adjusted under 35 U.S.C. 154(b) by 397 days.

(21) Appl. No.: 12/495,098

(22) Filed: Jun. 30, 2009

(65) Prior Publication Data
US 2010/0327956 A1 Dec. 30, 2010

(51) Int. Cl.
| | |
|---|---|
| H01L 29/06 | (2006.01) |
| H01L 29/16 | (2006.01) |
| H01L 21/02 | (2006.01) |
| H01L 29/778 | (2006.01) |
| H01L 29/786 | (2006.01) |
| B82Y 10/00 | (2011.01) |
| B82Y 40/00 | (2011.01) |
| H01L 29/66 | (2006.01) |
| H01L 29/775 | (2006.01) |

(52) U.S. Cl.
CPC ...... *H01L 29/1606* (2013.01); *H01L 21/02527* (2013.01); *H01L 21/02612* (2013.01); *H01L 21/02664* (2013.01); *H01L 29/7781* (2013.01); *H01L 29/78684* (2013.01); *B82Y 10/00* (2013.01); *B82Y 40/00* (2013.01); *H01L 29/66439* (2013.01); *H01L 29/775* (2013.01); *H01L 29/0673* (2013.01)

(58) Field of Classification Search
CPC .................................................. H01L 29/1606
USPC .......................................................... 257/29
See application file for complete search history.

(56) References Cited

U.S. PATENT DOCUMENTS

| 6,211,063 B1 | 4/2001 | Liu |
| 6,232,662 B1 | 5/2001 | Saran |
| 7,605,408 B1 | 10/2009 | Karkkainen et al. .......... 257/209 |

(Continued)

FOREIGN PATENT DOCUMENTS

| RU | 2077095 C1 | 4/1997 |
| RU | 2261499 C2 | 9/2005 |

(Continued)

OTHER PUBLICATIONS

Murali (Murali et al., "Breakdown current density of graphene nanoribbons" Appl. Phys. Lett. 94, 243114 (2009); doi: 10.1063/1.3147183).*

(Continued)

*Primary Examiner* — Peniel M Gumedzoe
*Assistant Examiner* — Christopher Johnson
(74) *Attorney, Agent, or Firm* — Harrington & Smith

(57) ABSTRACT

In accordance with an example embodiment of the present invention, a device comprising one or more porous graphene layers, the or each graphene porous layer comprising a multiplicity of pores. The device may form at least part of a flexible and/or stretchable, and or transparent electronic device.

10 Claims, 2 Drawing Sheets

(56) References Cited

U.S. PATENT DOCUMENTS

| | | |
|---|---|---|
| 2006/0286785 A1 | 12/2006 | Rogers et al. |
| 2007/0102111 A1 | 5/2007 | Monsma |
| 2007/0187694 A1* | 8/2007 | Pfeiffer .......................... 257/76 |
| 2008/0220154 A1* | 9/2008 | Gallagher .................... 427/115 |
| 2009/0110627 A1 | 4/2009 | Choi et al. ................. 423/447.1 |

FOREIGN PATENT DOCUMENTS

| | | |
|---|---|---|
| WO | 2008108383 A1 | 9/2008 |
| WO | 2009029984 A1 | 3/2009 |
| WO | WO-2009/035647 A1 | 3/2009 |
| WO | WO 2009029984 A1 * | 3/2009 |

OTHER PUBLICATIONS

Li et al., "Chemically Derived, Ultrasmooth Graphene Nanoribbon Semiconductors," Science 319, 1229 (2008); DOI: 10.1126/science.1150878.*

Kim et al., "Large-scale pattern growth of graphene films for stretchable transparent electrodes," Nature, vol. 457, Feb. 5, 2009, doi:10.1038/nature07719.*

Bai et al., "Graphene nanomesh", Nature Nanotech, vol. 5, p. 190, (Mar. 2010).*

Reina et al., "Nano Letters, Large Area, Few-Layer Graphene Films on Arbitrary Substrates by Chemical Vapor Deposition", Nano Letters, American Chemical Society, (Feb. 14, 2009) vol. 9, No. 1, (pp. 30-35).

Stankovich, et al., "Synthesis of Graphene-Based Nanosheets via Chemical Reduction of Exfoliated Graphite Oxide", (2007), (pp. 1558-1565).

Fan, et al, "Wafer-Scale Assembly of Semiconductor Nanowire Arrays by Contact Printing", Department of Electrical Engineering and Computer Sciences, (2007), (14 pages).

Kim, et al., "Large Scale Pattern Growth of Graphene Films for Stretchable Transparent Electrodes",vol. 457, (Feb. 2009), (pp. 706-710).

International Search Report and Written Opinion, received in corresponding Patent Cooperation Treaty Application No. PCT/IB2010/001453, Dated Nov. 11, 2010. 13 pages.

Murali, Raghunath, "Breakdown Current Density of Graphene Nanoribbons". Applied Physics Letters vol. 94, No. 24, pp. 243114-1-2243114-3. Jun. 19, 2009.; whole document; figure 1.

Bai, Jingwei, "Rational Fabrication of Graphene Nanoribbons Using a Nanowire Etch Mask". Nano Letters vol. 9, No. 5, pp. 2083-2087. May 13, 2009; whole document.

"графеновый прорыв" ; Apr. 15, 2008; whole document; retrieved from the Internet at http://www.nanonewsnet.ru/news/2008grafenovyi-propyv.

Kajii, H. et al.; "Electronic energy state of a periodic porous nanoscale graphite"; Journal of Physics D: Applied Physics; vol. 33; Dec. 21, 2000; pp. 3146-3151.

Alan Colli, "Nanowire Lithography on Silicon", Nano Letters 2008, vol. 8, No. 5, pp. 1358-1362.

K.S. Novoselov et. al., "Electric Field Effect in Atomically Thin Carbon Films", Science Magazine 306, 666, (2004), pp. 1-5.

Melinda Y. Han, et. al., "Electron Transport in Disordered Graphene Nanoribbons", Phys. Rev. Lett. vol. 104, No. 5, 2007.

Lin Xiao, "Flexible, Stretchable, Transparent Carbon Nanotube Thin Film Loudspeakers", Nano Letters, vol. 8, No. 12, 4539-4545, 2008.

J. Hone, et. al., "Quantized Phonen Spectrum of Single-Wall Carbon Nanotubes", Science Magazine 289, 1730, 2000.

Zhihong Chen, et. al., "Semiconducting Graphene Ribbon Transistor", Device Research Conference, IEEE, Jun. 18-20, p. 265-266, published year 2007.

Ozyilmaz, B. et. al., "Electronic Transport in Locally gated Graphene Nanoconstrictions", Department of Physics, Columbia University, as found in Appli. Phys. Lett. 91, 192107 (2007).

Yue Wu, et. al, "Single-Crystal Metallic Nanowires and Metal/Semiconductor Nanowire Heterostructures", Letters toNAture, vol. 430, Jul. 1, 2004, p. 61-65.

* cited by examiner

GRAPHENE DEVICE AND METHOD OF FABRICATING A GRAPHENE DEVICE

TECHNICAL FIELD

The present application relates generally to a device comprising graphene, and to a method for fabricating a device comprising graphene.

BACKGROUND

Graphene is a one-atom-thick planar sheet of $sp^2$-bonded carbon atoms that are densely packed in a honeycomb crystal lattice. It can be viewed as an atomic-scale chicken wire made of carbon atoms and their bonds. Graphene exhibits new types of fundamental physical properties not found in other materials. From a device point of view the most interesting are the high charge carrier mobility with ballistic transport, high current density, high thermal conductivity, and the possibility to control the electrical properties. In 2004, single graphene sheets, truly two-dimensional atomic thick carbon crystals, were verifiably isolated by mechanical exfoliation of graphite bulk. It has recently been discovered that graphene sheets may be fabricated. These graphene sheets are good conductors, for example about 20 times that of silicon MOSFETs.

Nanowire networks made for example of carbon nanotubes, or silicon nanowires have been studied for a number of years. However, these networks have rather low conductivity, due to high resistance wire-to-wire connections within the network.

SUMMARY

Various aspects of examples of the invention are set out in the claims.

According to a first aspect of the present invention, a device comprising a porous graphene layer comprising a multiplicity of pores.

The device may comprise a porous graphene layer having a porosity between 1% and 99%. The porous graphene layer may comprise a nanoribbon having a width between 0.1 nm and 20nm. The porous graphene layer may have a porosity such that, and configured such that the porous graphene layer is a semiconductor. The device may comprise a substrate, wherein the porous graphene layer is located on the substrate. The substrate may be configured such that it is flexible or stretchable. The device may comprise a substrate, and the porous graphene layer may cover an area on the substrate between 1 $\mu m^2$ and 10 $cm^2$. The porous graphene layer may comprise a monatomic porous graphene layer. The device may comprise a graphene electrode having a continuous layer of graphene having an area between 1 $\mu m^2$ and 10 $cm^2$. At least 90% of the graphene electrode surface area may be configured to be in contact with an insulator.

According to a second aspect of the present invention, a method comprising etching a layer of graphene, and inhibiting said etching using a nanowire mask.

According to a third aspect of the present invention, an electronic device comprising
 a first graphene electrode,
 a second graphene electrode,
 a graphene semiconductor, and
 an electrical power supply,
wherein the graphene semiconductor, first, and second graphene electrodes, are configured such that supply of a current by the electrical power supply, between a first location, in the first graphene electrode, and a second location, in the second graphene electrode, establishes a potential difference between the first location and the second location, and such that the potential difference remains substantially constant with variation of the first or second location.

According to a fourth aspect of the present invention, an electronic device comprising a first graphene electrode, a second graphene electrode, a graphene semiconductor, and an electrical power supply, the graphene semiconductor, first and second graphene electrodes, each being configured such that supply of a current by the power supply, between a first point, in the first graphene electrode, and a second point, in the second graphene electrode, establishes a potential difference between the points, and such that there is substantially no potential difference across the first graphene electrode, and substantially no potential difference across the second graphene electrode.

According to a fifth aspect of the present invention, a method of applying a potential difference between a first point, in a first graphene electrode, and a second point, in a second graphene electrode comprising:
 (i) locating a graphene semiconductor between the two electrodes;
 (ii) passing an electrical current through the graphene semiconductor and between the first and second points, such that a potential difference is established between the first and second points, and such that there is substantially no potential difference across the first graphene electrode, and substantially no potential difference across the second graphene electrode.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

Figure 1:
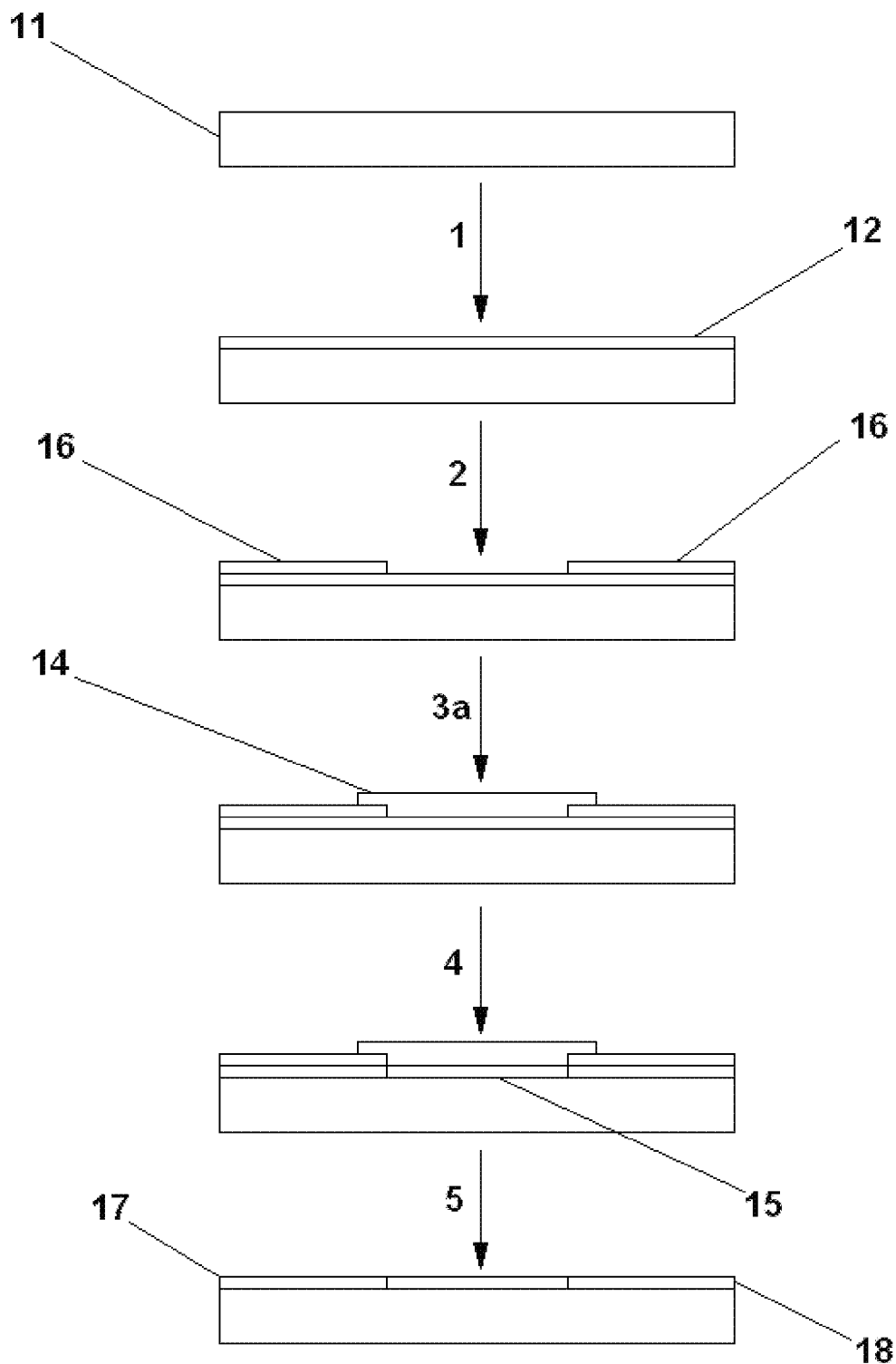
FIG. 1 shows a process for fabricating a device according to one aspect of the invention.
Figure 2:
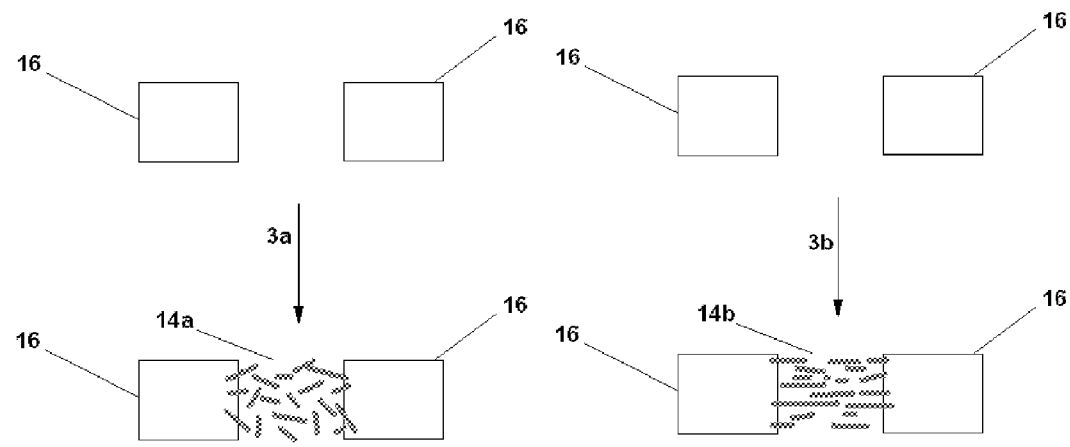
FIG. 2 shows a two variants for one of the stages in the FIG. 1 process.
Figure 3:
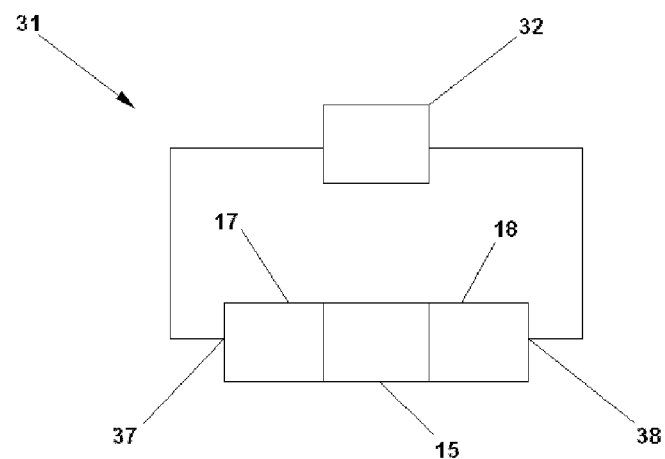
FIG. 3 shows a device according to one aspect of the invention.

An example embodiment of the present invention and its potential advantages are understood by referring to FIGS. 1 to 3 of the drawings.

FIG. 1 shows a fabrication process in accordance with one aspect of the present invention. An initial step 1 is deposition of a layer of graphene 12 on a substrate 11. One example process for implementing the deposition is described in US20090110627. The graphene deposition process comprises the forming a graphitizing catalyst; heat-treating a gaseous carbon source in the presence of the graphitizing catalyst to form graphene, and cooling the graphene to form a graphene layer 12.

The gaseous carbon source may comprise a compound having molecules containing between 1 and 7 carbon atoms, may comprise a compound selected from: carbon monoxide, ethane, ethylene, ethanol, acetylene, propane, propylene, butane, butadiene, pentane, pentene, cyclopentadiene, hexane, cyclohexane, benzene, toluene, methane, and a combination comprising at least one of the foregoing compounds.

The heat-treating may be performed at a temperature between 300 C to about 2000 C, and for between 0.001 hour to about 1000 hours. The graphitizing catalyst may comprise Ni, Co, Fe, Pt Au, Al, Cr, Cu, Mg, Mn, Mo, Rh, Si, Ta, Ti, W, U, V, Zr, or any combination thereof. Hydrogen is further supplied with the gaseous carbon source.

The graphene film 12 may be fabricated by chemical vapour deposition described by Alfonso Reina et al in Nano Letters, 9 (1), 30-35 (2009); or by chemical reduction of exfoliated graphite oxide, which is described by Stankovich, S. etc al, in Carbon 2007, 45 (7), 1558-1565.

Once the graphene layer 12 has been deposited, a continuous mask 16 may be fabricated by step 2, on the graphene layer 12, by electron beam lithography using a hydrogen silsesquioxane (HSQ) resist as described in "Semiconducting Graphene Ribbon Transistor" by Zhihong Chen et al, IEEE Xplore, p 265 to 266. Alternatively, once the graphene layer 12 has been deposited, a continuous mask 16 may be fabricated by step 2, on the graphene layer 12, using a hydrogen silsesquioxane (HSQ) deposition by a spin-on process. Example of such process is described in U.S. Pat. No. 6,232,662.

Once the continuous mask 16 has been deposited, a nanowire mask 14 is deposited, at step 3a. The nanowire mask comprises nanowires, such as silicon nanowires that may be randomly oriented. Step 3a may comprise fabrication of silicon nanowires on a sacrificial substrate and transfer of silicon nanowires on to the graphene layer 12 by mechanical contact pressure. An example of step 3a is described by Javey, A. et al in Nano Lett. 2007, 7, 773. Alternative methods of nanowire deposition are: spin casting, ink-jet printing, shear force contact printing, or nanowire suspensions as described in "Nanowire lithography on silicon", Alan Coli et al, Nano Lett, Vol 8, No 5, 2008, p 1358 to 1362.

Once the nanowire mask 14 has been deposited, graphene not under the continuous mask or nanowire mask 14 is removed by etching, at step 4. This can be implemented for example by using oxygen plasma in a reactive ion etching apparatus. One example of etching is described by B. Ozyilmaz et al in Appl. Phys. Lett. 91, 192107 (2007).

Once step 4 is complete, the continuous mask 16 is removed by step 5 that comprises a process of reactive ion etching. Example of the process is described in U.S. Pat. No. 6,211,063. The nanowire mask removed by using hydrogen fluoride solution, e.g. as described in "Single-crystal metallic nanowires and metal/semiconductor nanowire heterostructures" Yue Wu et al, Nature, Vol 430, 1 Jul. 2004, p 61 to 65.

Removal of part of the graphene layer 12 results in the formation of a porous graphene layer 15 having a multiplicity of pores which may correspond to the location of the nanowires in the nanowire mask 14. The porous graphene layer 15 may comprise a number of graphene nanoribbons, each nanoribbon having a smallest dimension, measured in the plane of the substrate, between 1 nm and 20 nm. Some graphene nanoribbons may be interstitial nanoribbons, each interstitial nanoribbon being located between at least two pores formed in graphene layer 15.

In accordance with a further aspect of the invention, the process shown in FIG. 1 may be repeated, with the exception of step 3, which may be replaced by an alternative step 3b. Steps 3a and 3b are shown in FIG. 2. Step 3a is the same as step 3 in FIG. 1. Step 3b differs from the step 3b, in that an electric field is applied in the vicinity of the continuous mask 16 such that an aligned nanowire mask 14b is deposited—The aligned nanowire mask 14b comprises nanowires that are aligned with by the presence of the electric field.

The electrical properties of components comprising one or more graphene ribbons may be altered by changing the width of the ribbon or ribbons. Depending on the width, the component may be a semiconductor or a metallic conductor.

FIG. 3 shows a device that may be fabricated by employing the FIG. 1 process, or by the variant of this process, partly depicted in FIG. 2. The device 31 comprises a power supply 32, a first graphene electrode 17, and a second graphene electrode 18. The device further comprises a graphene semiconductor 15, which is between, and in electrical contact with, the first and second graphene electrodes 17, 18. It has been shown that when graphene is confined to nanoribbons it changes from semi-metallic to semiconducting material, the graphene semiconductor 15 therefore comprises such nanoribbons. A potential difference is applied between a first point 37, in the first graphene electrode 17, and a second point 38, in the second graphene electrode 18, and an electric current is passed through the graphene semiconductor 15, between the first and second points 37, 38, such that a potential difference is established between the first and second points, and such that there is substantially no potential difference across the first graphene electrode 17, and substantially no potential difference across the second graphene electrode 18. In other words the potential difference remains constant with variation of the first or second location. The graphene electrodes 17, 18, and the graphene semiconductor 15 may have a low coefficient of absorption, and/or be flexible and/or stretchable. The FIG. 3 device 31 may therefore be at least partly flexible and/or stretchable, and at least partly transmit light through some of its components. A modification of the FIG. 3 device may comprise a gate electrode, disposed between electrodes 17 and 18, in contact with the semiconductor 15, to which a potential may be applied, such a modification may form part of a field effect transistor.

Without in any way limiting the scope, interpretation, or application of the claims appearing below, a technical effect of one or more of the example embodiments disclosed herein may be fabrication of large surface area graphene layers. Another technical effect of one or more of the example embodiments disclosed herein may be fabrication of transparent electronic devices. Another technical effect of one or more of the example embodiments disclosed herein may be fabrication of flexible and/or stretchable electronic devices. Yet another technical advantage may high charge carrier mobility. Yet other advantages may be at least one of ballistic transport, high current density, high thermal conductivity, and the possibility to control the electrical properties.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:
1. A device comprising:
  a substrate, said substrate being at least one of a flexible and a stretchable layer; and
  a porous graphene layer, said porous graphene layer being on said substrate and having a multiplicity of pores, said porous graphene layer including at least one graphene nanoribbon having a porosity providing said at least one graphene nanoribbon with semiconductivity, whereby said device is at least one of flexible and stretchable.

2. A device according to claim 1 wherein the device comprises a graphene electrode.

3. A device according to claim 2 wherein the device comprises a multiplicity of graphene electrodes.

4. A device according to claim 2 wherein the graphene electrode comprises a graphene conductor.

5. A device according to claim 2 wherein the graphene electrode comprises a continuous layer of graphene.

6. A device according to claim 3 wherein the porous graphene layer electrically connects two of the graphene electrodes.

7. A device according to claim 3 wherein the porous graphene layer electrically connects each of the graphene electrodes.

8. A device comprising:

a substrate, said substrate being at least one of a flexible and stretchable layer; and a porous graphene layer, said porous graphene layer being on said substrate and having a multiplicity of pores, said porous graphene layer including at least one graphene nanoribbon having a porosity providing said at least one graphene nanoribbon with semiconductivity, wherein said porous graphene layer includes at least one of at least one graphene ribbon and at least one graphene electrode, whereby said device is at least one of flexible and stretchable.

9. A device according to claim 8, wherein the porous graphene layer comprises at least one graphene ribbon and at least one graphene electrode, and wherein the at least one graphene ribbon electrically connects with the at least one graphene electrode.

10. A device according to claim 9 wherein the at least one graphene electrode comprises two graphene electrodes; and wherein the at least one graphene ribbon electrically connects the two graphene electrodes.

* * * * *